(12) United States Patent
Jeong et al.

(10) Patent No.: US 10,846,220 B2
(45) Date of Patent: Nov. 24, 2020

(54) MEMORY SYSTEM AND OPERATION METHOD THEREOF

(71) Applicant: SK hynix Inc., Gyeonggi-do (KR)

(72) Inventors: Seung-Gyu Jeong, Seoul (KR); Dong-Gun Kim, Gyeonggi-do (KR); Do-Sun Hong, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 84 days.

(21) Appl. No.: 15/873,981

(22) Filed: Jan. 18, 2018

(65) Prior Publication Data

US 2019/0012264 A1    Jan. 10, 2019

(30) Foreign Application Priority Data

Jul. 10, 2017    (KR) .................. 10-2017-0087141

(51) Int. Cl.
| | |
|---|---|
| *G06F 12/0804* | (2016.01) |
| *G06F 12/1009* | (2016.01) |
| *G06F 3/06* | (2006.01) |
| *G11C 7/10* | (2006.01) |
| *G06F 13/16* | (2006.01) |
| *G11C 16/10* | (2006.01) |
| *G11C 16/26* | (2006.01) |
| *G11C 8/12* | (2006.01) |

(52) U.S. Cl.
CPC .......... *G06F 12/0804* (2013.01); *G06F 3/061* (2013.01); *G06F 3/0656* (2013.01); *G06F 3/0658* (2013.01); *G06F 3/0673* (2013.01); *G06F 12/1009* (2013.01); *G06F 13/16* (2013.01); *G06F 13/1631* (2013.01); *G11C 7/1087* (2013.01); *G11C 16/10* (2013.01); *G11C 16/26* (2013.01); *G11C 8/12* (2013.01); *G11C 2207/2245* (2013.01); *G11C 2207/2263* (2013.01)

(58) Field of Classification Search
CPC .......................... G06F 12/00; G06F 12/0804
USPC ........................................................ 711/104
See application file for complete search history.

(56) References Cited

U.S. PATENT DOCUMENTS

| | | | |
|---|---|---|---|
| 8,886,871 B2 | 11/2014 | Pyeon et al. | |
| 8,954,687 B2 * | 2/2015 | Jeddeloh ............... | G06F 13/161 |
| | | | 711/105 |
| 2006/0087893 A1 * | 4/2006 | Nishihara ........... | G06F 12/0246 |
| | | | 365/145 |

(Continued)

FOREIGN PATENT DOCUMENTS

KR        1020160032934        3/2016

*Primary Examiner* — Gautam Sain
(74) *Attorney, Agent, or Firm* — IP & T Group LLP

(57) ABSTRACT

A memory system may include: a memory device having a plurality of banks, each comprising a memory cell region including a plurality of memory cells, and a page buffer unit; and a controller suitable for receiving a write address and write data from a host, and controlling a write operation of the memory device, wherein the controller comprises: a page buffer table (PBT) comprising fields to retain the same data as the page buffer units of the respective banks; and a processor suitable for comparing the write data to data stored in a field of the PBT, corresponding to the write address, and controlling the memory device to write the write data or the data stored in the page buffer unit to memory cells selected according to the write address, based on a comparison result.

19 Claims, 12 Drawing Sheets

(56) References Cited

U.S. PATENT DOCUMENTS

| | | | |
|---|---|---|---|
| 2007/0214310 A1* | 9/2007 | Ishimoto | G06F 12/0246 |
| | | | 711/103 |
| 2008/0266991 A1* | 10/2008 | Lee | G06F 11/1044 |
| | | | 365/203 |
| 2010/0106890 A1* | 4/2010 | Lasser | G06F 12/0246 |
| | | | 711/103 |
| 2012/0159072 A1* | 6/2012 | Hida | G06F 12/0862 |
| | | | 711/119 |

* cited by examiner

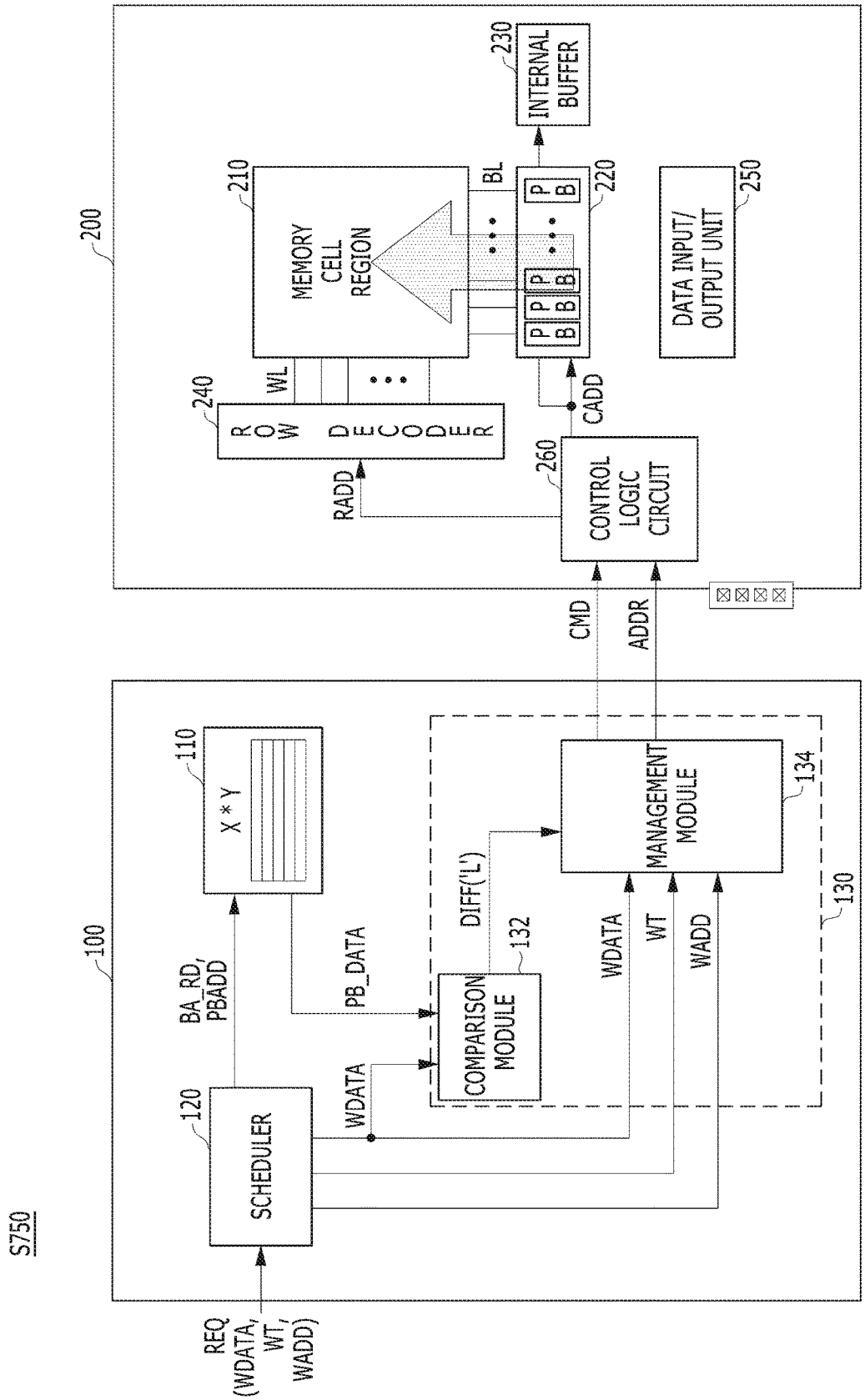

MEMORY SYSTEM AND OPERATION METHOD THEREOF

CROSS-REFERENCE TO RELATED APPLICATIONS

The present application claims priority to Korean Patent Application No. 10-2017-0087141, filed on Jul. 10, 2017, which is incorporated herein by reference in its entirety.

BACKGROUND

1. Field

Exemplary embodiments of the present disclosure generally relate to a memory system including a memory device, and a memory controller for controlling the memory device.

2. Description of the Related Art

With increasing demand for high capacity and low power consumption of memory devices, research has been conducted on next-generation memory devices that have a nonvolatile characteristic and do not require refresh operations. Such next-generation memory devices are required to have the high density of a dynamic random access memory (DRAM), the nonvolatile characteristic of a flash memory, and the high speed of a static random access memory (SRAM). Examples of the next-generation memory devices, which can meet the above-described requirements, may include a phase change random access memory (PCRAM), nano floating gate memory (NFGM), polymer random access memory (PoRAM), magnetic random access memory (MRAM), ferroelectric random access memory (FeRAM), and resistive random access memory (RRAM).

SUMMARY

Various embodiments are directed to a memory system capable of efficiently transmitting data between a memory device and a controller.

In an embodiment, a memory system may include: a memory device having a plurality of banks, each comprising a memory cell region including a plurality of memory cells, and a page buffer unit; and a controller suitable for receiving a write address and write data from a host, and controlling a write operation of the memory device, wherein the controller comprises: a page buffer table (PBT) comprising fields to retain the same data as the page buffer units of the respective banks; and a processor suitable for comparing the write data to data stored in a field of the PBT, corresponding to the write address, and controlling the memory device to write the write data or the data stored in the page buffer unit to memory cells selected according to the write address, based on a comparison result.

In an embodiment, an operation method of a memory system may include: providing a memory device having a plurality of banks each including a memory cell region including a plurality of memory cells, and a page buffer unit, and a controller including a page buffer table (PBT) having fields to retain the same data as the page buffer units of the respective banks: receiving a write address and write data from a host; comparing the write data to data stored in a field of the PBT, corresponding to the write address, and outputting a comparison signal; writing data stored in the page buffer unit to memory cells selected according to the write address, when the comparison signal indicates that the data are same; and writing the write data to the selected memory cells when the comparison signal indicates that the data are different from each other.

In an embodiment, an operation method of a memory system may include: providing a memory device having a plurality of banks each including a memory cell region including a plurality of memory cells, and a page buffer unit, and a controller including a page buffer table (PBT) having fields to retain the same data as the page buffer units of the respective banks: receiving a read address from a host; comparing, by the memory device, data read from memory cells selected according to the read address to data stored in the page buffer unit; outputting, by the memory device, a match signal to the controller without outputting the data read from the selected memory cells, when a comparison result indicates that the data are same; and outputting, by the memory device, the data read from the selected memory cells as read data to the controller, when the comparison result indicates that the data are different from each other.

BRIEF DESCRIPTION OF THE DRAWINGS

FIGS. 8A and 8B are block diagrams illustrating in detail parts of the write operation of FIG. 7.

DETAILED DESCRIPTION

Figure 1:
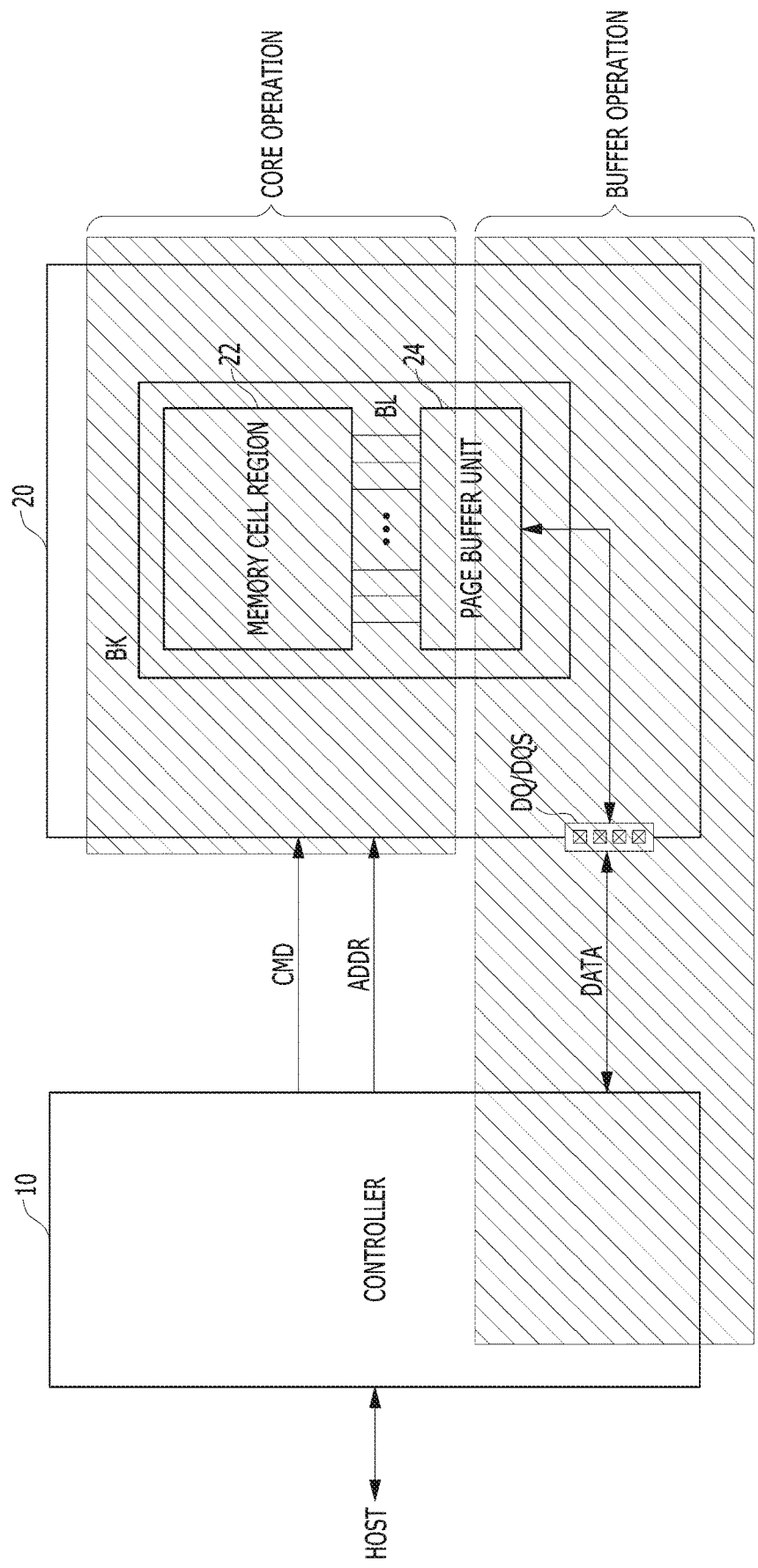
FIG. 1 is a block diagram illustrating a data transmission operation of a memory system.

Various embodiments of the present invention are described below in more detail with reference to the accompanying drawings. We note, however, that the present invention may be embodied in different forms and variations, and should not be construed as being limited to the embodiments set forth herein. Rather, the described embodiments are provided so that this disclosure will be thorough and complete, and will fully convey the present invention to those skilled in the art to which this invention pertains. Throughout the disclosure, like reference numerals refer to like parts throughout the various figures and embodiments of the present invention.

The drawings are not necessarily to scale and, in some instances, proportions may have been exaggerated in order to clearly illustrate features of the embodiments.

In the present specification, terms such as "first" and "second" are used to distinguish between elements, and not used to define the components or mean a specific order. Furthermore, when an element is referred to as being located "on" another element or being located "over", "under" or "beside" another element, it may indicate a relative positional relation, but not define a specific case in which the latter element is in direct contact with the former element or another element is interposed at the interface therebetween. In addition, when any one element is referred to as being "coupled" or "connected" to another element, it may indicate that the elements are electrically or mechanically coupled or connected to each other, or other separate elements are interposed therebetween so as to construct a coupling relation or connection relation.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

Hereinafter, the various embodiments of the present invention will be described in detail with reference to the attached drawings.

FIG. 1 is a block diagram illustrating a data transfer operation of a memory system.

Referring to FIG. 1, the memory system may include a controller 10 and a memory device 20. The memory device 20 may include one or more banks BK, and each of the banks BK may include a memory cell region 22 and a page buffer unit 24, which is coupled to the memory cell region 22 through a plurality of bit lines BL.

During a write operation, the controller 10 may transmit data DATA, a command CMD, and an address ADDR to the memory device 20. During a read operation, the controller 10 may transmit the command CMD and the address ADDR to the memory device 20, and read data DATA from the memory device 20.

The write operation and the read operation of the memory system may be divided into a buffer operation and a core operation. The buffer operation may be defined as a data transmission operation performed between the controller 10 and the page buffer unit 24 of the memory device 20, and the core operation may be defined as a data transmission operation performed between the page buffer unit 24 and the memory cell region 22 of the memory device 20. Since the buffer operation includes an operation of storing data inputted through a data pad DQ into the page buffer unit 24 in response to a data strobe signal inputted through a data strobe pad DQS from the controller 10, or an opposite operation thereof, the buffer operation may toggle the data and the data strobe signal, which causes power consumption.

Hereafter, the present disclosure provides a method capable of selectively performing the buffer operation, which is performed between the controller and the page buffer unit, according to the data stored in the page buffer unit during the write and read operations. This method will minimize toggling of the data and the data strobe signal while reducing power consumption.

Figure 2:
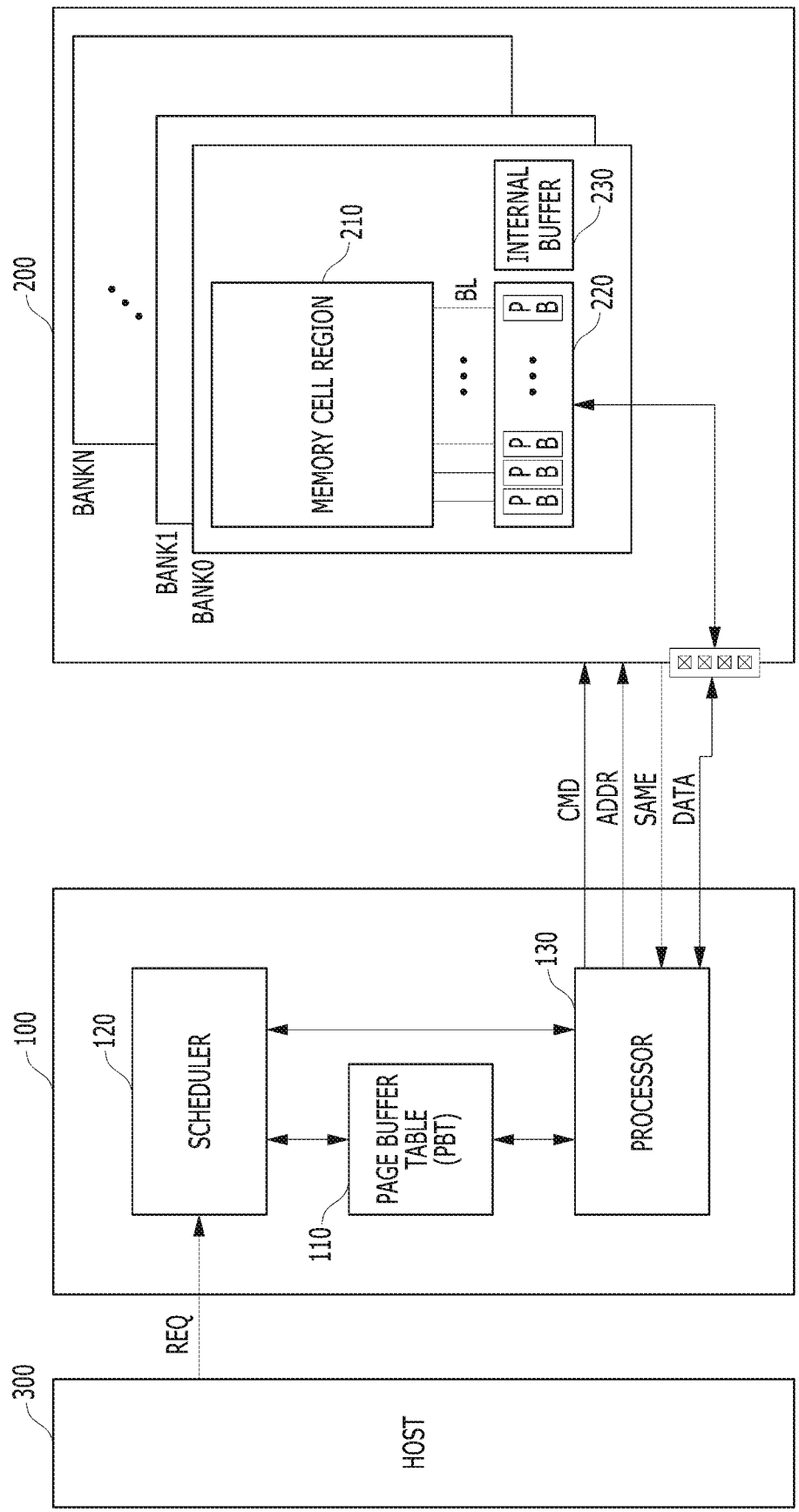
FIG. 2 is a block diagram illustrating a memory system in accordance with an embodiment of the present invention.

FIG. 2 is a block diagram illustrating a memory system in accordance with an embodiment of the present invention.

Referring to FIG. 2, the memory system may include a controller 100 and a memory device 200.

The memory device 200 may include a plurality of banks BANK0 to BANKN. Each of the banks BANK0 to BANKN may include a memory cell region 210 and a page buffer unit 220. The memory cell region 210 may include a plurality of memory cells, and the page buffer unit 220 may include a plurality of page buffers PB, which are coupled to the memory cells through a plurality of bit lines BL. The memory cells of the memory device 200 may include resistive memory elements, and the memory device 200 may include a phase change random access memory (PCRAM). Since a read or write operation of the memory device 200 is performed on a page basis, page-based data may be stored in the page buffer unit 220 during one read or write operation.

The controller 100 may transmit a command CMD, data DATA, and an address ADDR to the memory device 200 in response to a request REQ inputted from a host 300.

When the request REQ inputted from the host 300 is a write request, the controller 100 may transmit a write command, data to be written (hereafter, referred to as 'write data'), and an address corresponding to a target memory cell of the memory cell region 210 (hereafter, referred to as 'write address') as the command CMD, the data DATA, and the address ADDR, respectively, to the memory device 200, and control a write operation to write the data DATA to the target memory cell selected according to the address ADDR. On the other hand, when the request REQ inputted from the host 300 is a read request, the controller 100 may transmit a read command and an address corresponding to a target memory cell of the memory cell region 210 (hereafter, referred to as 'read address') as the command CMD and the address ADDR, respectively, to the memory device 200, and control a read operation to read data DATA from the target memory cell selected according to the address ADDR.

The controller 100 may include a page buffer table (PBT) 110, a scheduler 120, and a processor 130.

The PBT 110 may include a memory to retain the same data as the page buffer units 220 of the respective banks. In one exemplary embodiment of the present disclosure, the PBT 110 may include a static random access memory (SRAM). The PBT 110 may have a plurality of fields corresponding to the number of the banks BANK0 to BANKN, that is, (N+1) fields, and each of the fields may have a size corresponding to the size (data width) of the page buffer unit 220 in each of the banks BANK0 to BANKN. At this time, since the fields of the PBT 110 correspond to the respective banks BANK0 to BANKN, each of the fields may be designated by the address ADD containing bank information. In another exemplary embodiment of the present disclosure, the PBT 110 may be implemented in an SRAM (not illustrated) to be used as a working memory of the controller 100.

The scheduler 120 may receive requests REQ from the host 300 and adjust an order of operations to be processed by the memory device 200. During a write operation, the scheduler 120 may schedule the operations to write the same data to the same bank. In order to improve the performance of the memory device 200, the scheduler 120 may schedule operations of the memory device 200 in an order different from the order that the requests REQ were received from the host 300. For example, although the host 300 may first request a read operation of the memory device 200 before requesting a write operation, the scheduler 120 may nonetheless adjust the operation order such that the write operation is performed before the read operation. In particular, the scheduler 120 in accordance with the present embodiment may schedule an operation order to write the same write data to the same bank, when a write request is inputted.

According to the scheduling of the scheduler 120, the processor 130 may transmit the command CMD, the data DATA, and the address ADDR to the memory device 200.

During a write operation, the processor 130 may compare write data to data stored in a field of the PBT 110 corresponding to a write address, and transmit only a write command and the write address as the command CMD and the address ADDR, respectively, to the memory device 200 when the comparison result indicates that the write data and the data are the same. However, when the comparison result indicates that the write data and the data are different from each other, the processor 130 may transmit the write command, the write address, and the write data as the command CMD, the address ADDR, and the data DATA, respectively, to the memory device 200. Therefore, when the comparison result indicates that the write data and the data are the same, the processor 130 may control the memory device 200 to write data stored in the page buffer unit 220 to a target memory cell selected according to the address ADDR. On the other hand, when the comparison result indicates that the write data and the data are different from each other, the processor 130 may control the memory device 200 to store the data DATA transmitted from the controller 100 into the target memory cell selected according to the address ADDR. Furthermore, when the comparison result indicates that the write data and the data are different from each other, the processor 130 may select a field of the PBT 110 according to the address ADDR, and update the selected field to the data DATA, such that the PBT 110 can retain the same data as the page buffer units 220 of the respective banks.

During a read operation, the memory device 200 may compare data read from a target memory cell selected according to the address ADDR to the data stored in the page buffer unit 220. When the comparison result indicates that the read data and the data stored in the page buffer unit 220 are the same, the memory device 200 may not output the data read from the target memory cell, but output a 1-bit match signal SAME. When the comparison result indicates that the read data and the data stored in the page buffer unit 220 are different from each other, the memory device 200 may output the data read from the target memory cell as the data DATA. Thus, the controller 100 may transmit the match signal SAME or the data DATA outputted from the memory device 200 to the host 300. Furthermore, when the comparison result indicates that the read data and the data stored in the page buffer unit 220 are different from each other, the processor 130 may select a field of the PBT 110 according to the address ADDR, and update the selected field to the data DATA, such that the PBT 110 can retain the same data as the page buffer units 220 of the respective banks.

Each bank BANK0 to BANKN of the memory device 200 may further include an internal buffer 230. The internal buffer 230 may correspond one-to-one to the page buffer unit 220 in each of the banks, and have the same storage size as the page buffer unit 220. The internal buffer 230 may be controlled to store the same data as the data stored in the page buffer unit 220 whenever the PBT 110 is updated. Thus, during the read operation, the memory device 200 may read data from the target memory cell selected according to the address ADDR, store the read data in the page buffer unit 220, and compare the data stored in the page buffer unit 220 to the data stored in the internal buffer 230 (that is, the data stored in the page buffer unit 220 during the previous operation).

Although not illustrated in FIG. 2, the memory system may further include a host interface for interfacing the host 300 and the controller 100, and a memory interface for interfacing the controller 100 and the memory device 200. The host interface may be positioned between the host 300 and the scheduler 120, receive requests REQ inputted from the host 300, transmit the received requests REQ to the scheduler 120, and transmit processing results of the requests REQ from the scheduler 120 to the host 300. The memory interface may be positioned between the processor 130 and the memory device 200, transmit the command CMD and the address ADD from the processor 130 to the memory device 200, and transmit/receive the data DATA between the memory device 200 and the processor 130.

As described above, the memory system in accordance with the present embodiment can skip a buffer operation when the write data and the data stored in a page buffer of the memory device during the write operation are the same, and skip a buffer operation when the read data and the data stored in a page buffer during the read operation are the same. Therefore, during the write operation or the read operation, the memory system can minimize data toggling by the buffer operation, and thus reduce and minimize power consumption.

Figure 3:
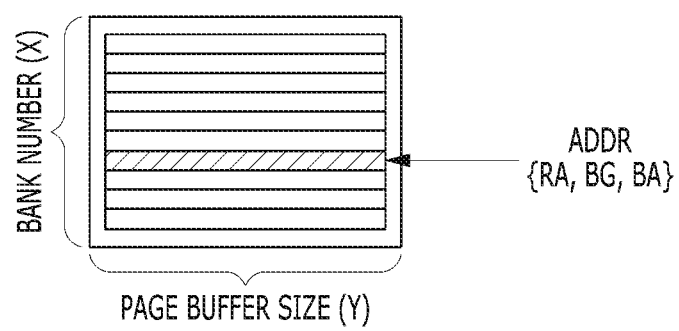
FIG. 3 is a diagram illustrating a page buffer table of FIG. 2.
Figure 4:
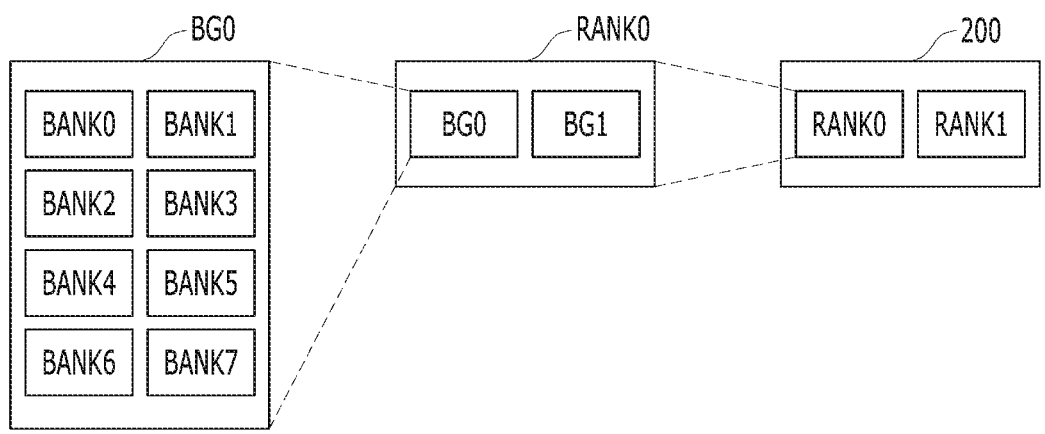
FIG. 4 is a diagram illustrating a relationship between banks and the page buffer table of FIG. 2.

FIG. 3 is a diagram illustrating the PBT 110 of FIG. 2. FIG. 4 is a diagram illustrating a relationship between the banks BANK0 to BANKN and the PBT 110 of FIG. 2.

Referring to FIG. 3, the PBT 110 may have X fields corresponding to the number of the banks BANK0 to BANKN (that is, (N+1) banks), and each of the fields may have a size Y corresponding to the size (data width) of the page buffer unit 220 in each of the banks.

FIG. 4 illustrates that the memory device 200 has a multi-rank structure including a plurality of ranks. For example, when it is assumed, for instance, that the memory device 200 includes two ranks RANK0 and RANK1, each of the ranks includes two bank groups BG0 and BG1, and each of the bank groups includes eight banks BANK0 to BANK7, the memory device 200 may include 32(=8*2*2) banks. At this time, when it is assumed that a data unit processed at a time, that is, a data width of 512 bits, the PBT 110 may include 32 fields, and each of the fields may be set to 512 bits. Thus, the PBT 110 may have a size of 32 (X)*512 (Y). However, illustrations shown in FIG. 4 are merely an example, and the bank configuration and number of the memory device 200 in accordance with the present embodiment are not limited thereto.

Referring back to FIG. 3, since the fields of the PBT 110 correspond to the respective banks BANK0 to BANKN, each of the fields may be designated by the address ADD containing bank information. In the memory device 200 having the structure of FIG. 4, the address ADDR may include rank information, bank group information, and bank information. For example, each field of the PBT 110 may be designated according to the address ADDR including {rank address RA, bank group address BG, bank address BA}.

Figure 5A:
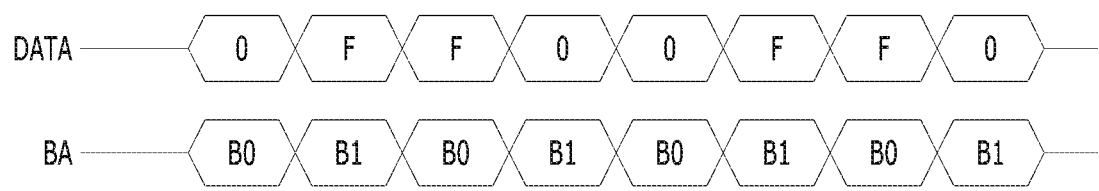
FIGS. 5A and 5B are timing diagrams illustrating an operation of a scheduler of FIG. 2.
Figure 5B:
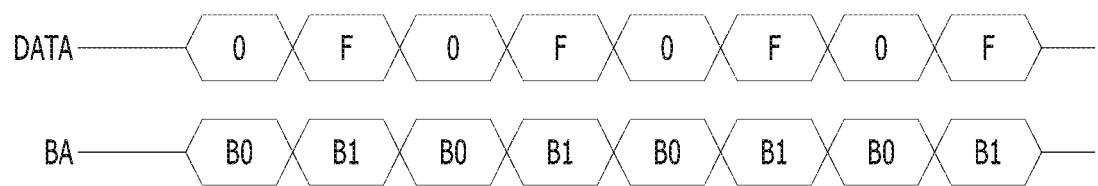

FIGS. 5A and 5B are timing diagrams illustrating an operation of the scheduler. More specifically, FIG. 5A illustrates an operation of a conventional scheduler and FIG. 5B illustrates the operation of the scheduler 120 of FIG. 2 in accordance with the present embodiment. For convenience of description, FIGS. 5A and 5B illustrate that two banks are designated by the bank address BA, and 4-bit data DATA are transmitted.

Referring to FIG. 5A, the conventional scheduler may receive requests REQ from the host, and adjust an order of operations to be processed by the memory device. For example, when the corresponding request REQ is a write request, the conventional scheduler may schedule input data DATA in an interleaving manner such that the data DATA are alternately written to first and second banks B0 and B1. Therefore, during each write operation, each of the banks may store the data DATA different from data written during the previous write operation.

Referring to FIG. 5B, the scheduler according to an embodiment of the present disclosure, for example, the scheduler 120 of FIG. 2, may receive requests REQ from the host, and adjust an order of operations to be processed by the memory device. When a write request is inputted, the scheduler 120 may schedule the operations to write the same data DATA to the same bank. For example, the scheduler 120 may schedule the operations such that first data '0' of the data DATA are written to the first bank B0 and second data 'F' of the data DATA are written to the second bank B1. Therefore, during the write operation, the memory system in accordance with the present embodiment can perform scheduling to input the same data to each of the banks, and skip a buffer operation when the write data and the data stored in the page buffer unit are the same, thereby increasing efficiency and reducing power consumption.

Hereafter, the configuration of the memory system of FIG. 2 will be described in more detail with reference to FIG. 6. The same components are represented by like reference numerals, and the duplicated descriptions are omitted herein for brevity.

Figure 6:
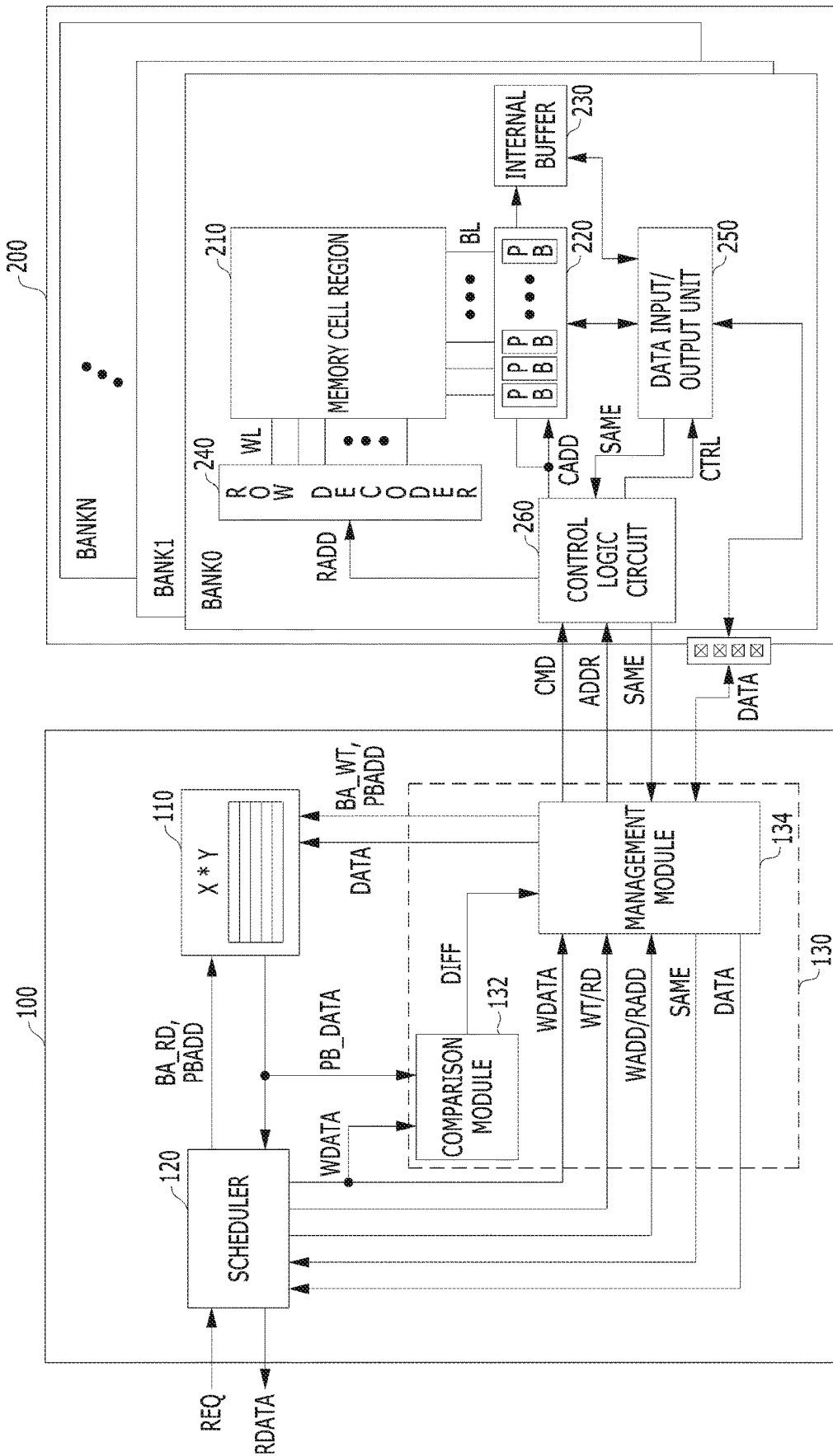
FIG. 6 is a detailed block diagram of a memory system in accordance with an embodiment of the present invention.

FIG. 6 is a detailed block diagram of a memory system in accordance with an embodiment of the present invention.

Referring to FIG. 6, the scheduler 120 may receive requests REQ from the host (not illustrated) and adjust an order of operations to be processed by the memory device 200. At this time, the scheduler 120 may schedule the operation order to write the same data to the same bank. After the scheduling, the scheduler 120 may transmit a write command WT, write data WDATA, and a write address WADD to the processor 130 according to a write request, or transmit a read command RD and a read address RADD to the processor 130 according to a read request, and provide read data RDATA to the host according to the data DATA or the match signal SAME provided from the memory device 200. The scheduler 120 may transmit a table read command BA_RD and a table address PBADD corresponding to the write address WADD to the PBT 110 in response to the write request, or transmit the table read command BA_RD and the table address PBADD corresponding to the read address RADD to the PBT 110 in response to the read request and the match signal SAME.

The PBT 110 may output table data PB_DATA of a field corresponding to the table address PBADD in response to the table read command BA_RD. The PBT 110 may write the data DATA to a field corresponding to the table address PBADD in response to a table write command BA_WT, in order to update the field.

The processor 130 may include a comparison module 132 and a management module 134.

The comparison module 132 may compare the write data WDATA and the table data PB_DATA, and output a comparison signal DIFF, during a write operation. The comparison signal DIFF may have a logic low level when the write data WDATA and the table data PB_DATA are the same, and have a logic high level when the write data WDATA and the table data PB_DATA are different from each other.

The management module 134 may decide whether to transmit the write data WDATA to the memory device 200, in response to the comparison signal DIFF, during the write operation. When the comparison signal DIFF is at a logic low level (that is, when the write data WDATA and the table data PB_DATA are the same), the management module 134 may transmit only the write address WADD and the write command WT, without the write data WDATA, as the address ADDR and the command CMD, respectively, to the memory device 200. On the other hand, when the comparison signal DIFF is at a logic high level (that is, when the write data WDATA and the table data PB_DATA are different from each other), the management module 134 may transmit the write data WDATA, the write address WADD, and the write command WT as the data DATA, the address ADDR, and the command CMD, respectively, to the memory device 200. At this time, the management module 134 may transmit the data DATA, the table address PBADD, and the table write command BA_WT to the PBT 110.

During a read operation, the management module 134 may provide the read command RD and the read address RADD, as the command CMD and the address ADDR, respectively, to the memory device 200, and transmit the data DATA or the 1-bit match signal SAME received from the memory device 200 to the scheduler 120. When the data DATA are inputted, the management module 134 may provide the data DATA, the table address PBADD corresponding to the read address RADD, and the table write command BA_WT to the PBT 110.

The memory device 200 may include the plurality of banks BANK0 to BANKN. Each of the banks BANK0 to BANKN may include the memory cell region 210, the page buffer unit 220, the internal buffer 230, a row decoder 240, a data input/output unit 250, and a control logic circuit 260.

The control logic circuit 260 may control the page buffer unit 220, the internal buffer 230, the row decoder 240, and the data input/output unit 250. The control logic circuit 260 may receive the address ADDR to generate a row address RADD and a column address CADD, and receive the command CMD to generate an input/output control signal CTRL. Though FIG. 6 illustrates the control logic circuit 260 generating the row address RADD and the column address CADD, the present embodiment is not limited thereto. That is, according to an embodiment, an address buffer (not shown) may be provided to receive the command CMD to generate the row address RADD and the column address CADD.

The row decoder 240 may be coupled to the memory cell region 210 through a plurality of word lines WL, and select memory cells coupled to a word line WL based on the row address RADD.

Each of the banks BANK0 to BANKN may further include a column decoder (not illustrated) that receives the column address CADD, and decodes the column address CADD to generate a signal for controlling the page buffer unit 220. For convenience of description, the embodiment shown in FIG. 6 may be based on the supposition that the page buffer unit 220 and the internal buffer 230 are directly operated according to the column address CADD. However, the present embodiment is not limited thereto, and the page buffer unit 220 and the internal buffer 230 may also be indirectly operated according to a signal obtained by decoding the column address CADD, in which case each of the banks BANK0 to BANKN may further include a column decoder that receives the column address CADD.

The page buffer unit 220 may include the plurality of page buffers PB coupled to the memory cell region 210 through a plurality of bit lines BL, respectively. Each of the page buffers PB may sense data read from a memory cell through the corresponding bit line BL according to the column address CADD, and store the sensed data therein.

The internal buffer 230 may correspond one-to-one to the page buffer unit 220 in each of the banks BANK0 to BANKN, and have the same storage size as the page buffer unit 220. According to the column address CADD, the internal buffer 230 may store the data DATA transmitted from the data input/output unit 250 during the write operation, and output the data stored therein to the data input/output unit 250 during the read operation.

The data input/output unit 250 may input/output the data DATA to/from the page buffer unit 220 according to the input/output control signal CTRL. During the write operation, the data input/output unit 250 may transmit the data DATA received from the controller 100 to the page buffer unit 220 and the internal buffer 230 according to the input/output control signal CTRL. During the read operation, the data input/output unit 250 may compare the data stored in the page buffer unit 220 to the data stored in the internal buffer 230 according to the input/output control signal CTRL, and decide whether to output the data stored in the page buffer unit 220 or output the 1-bit match signal SAME according to the comparison result.

Meanwhile, since the data input/output unit 250 performs a comparison operation as well as a data input/output operation, the control logic circuit 260 needs to generate the input/output control signal CTRL that is distinguished from the existing read operation. For this operation, during the read operation in accordance with the present embodiment, the management module 134 may set a specific bit of the address ADDR (for example, an unused bit among the bits of the address ADDR) when providing the command CMD and the address ADDR to the memory device 200, the control logic circuit 260 may generate the input/output control signal CTRL according to the command CMD and the specific bit of the address ADDR, and the data input/output unit 250 may perform the data input/output operation and the comparison operation according to the input/output control signal CTRL. For example, the management module 134 may set the most significant bit (MSB) of the address ADDR, and the control logic circuit 260 may generate the input/output control signal CTRL to perform the comparison operation according to the command CMD and the MSB of the address ADDR.

Hereafter, referring to FIGS. 6 to 8B, the write operation of the memory device in accordance with the present embodiment will be described.

Figure 7:
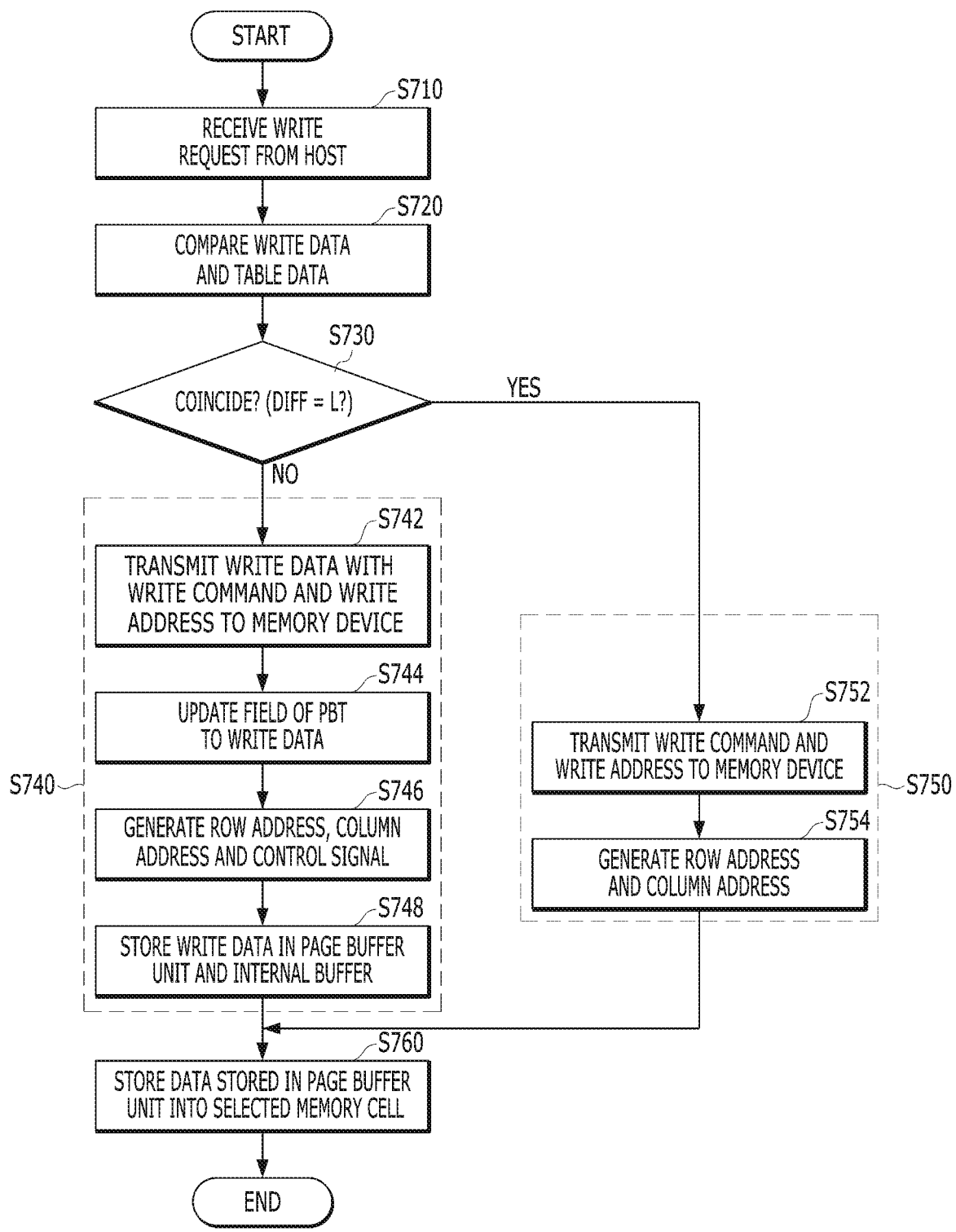
FIG. 7 is a flowchart explaining a write operation of a memory system in accordance with an embodiment of the present invention.
Figure 8A:
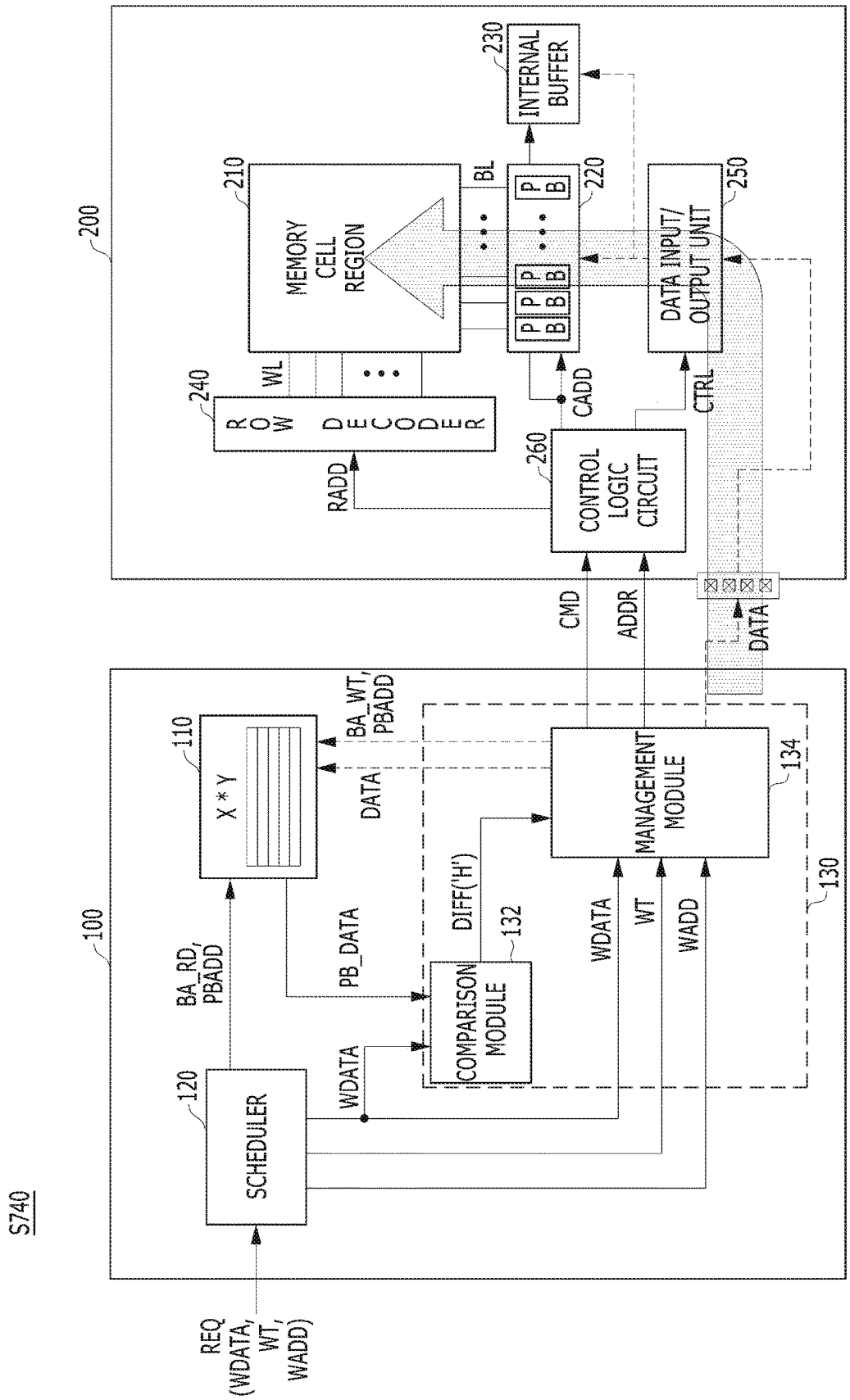

FIG. 7 is a flowchart explaining a write operation of a memory system in accordance with an embodiment of the present invention. FIGS. 8A and 8B are block diagrams illustrating in detail parts of the write operation of FIG. 7. For convenience of description, FIGS. 8A and 8B illustrate only one bank.

Referring to FIG. 7, at step S710, the controller 100 may receive the write request REQ from the host. The write request REQ may include the write command WT, the write data WDATA, and the write address WADD.

The scheduler 120 may receive the write request REQ and adjust an order of operations to be processed by the memory device 200. At this time, the scheduler 120 may schedule the operations to write the same data to the same bank during the write operation. The scheduler 120 may transmit the table read command BA_RD and the table address PBADD corresponding to the write address WADD to the PBT 110. The PBT 110 may output the table data PB_DATA of a field corresponding to the table address PBADD in response to the table read command BA_RD.

Then, at step S720, the comparison module 132 may compare the write data WDATA and the table data PB_DATA, and output the comparison signal DIFF. The comparison signal DIFF may have a logic low level when the write data WDATA and the table data PB_DATA are the same, and have a logic high level when the write data WDATA and the table data PB_DATA are different from each other.

At step S730, the management module 134 may decide whether to transmit the write data WDATA to the memory device 200, in response to the comparison signal DIFF.

FIG. 8A illustrates an operation (step S740 of FIG. 7) of the memory system when the comparison signal DIFF is at a logic high level. When the comparison signal DIFF is at a logic high level (that is, "NO" at step S730), the management module 134 may transmit the write data WDATA, the write address WADD, and the write command WT as the data DATA, the address ADDR, and the command CMD, respectively, to the memory device 200, at step S742. At this time, the management module 134 may transmit the data DATA, the table address PBADD, and the table write command BA_WT to the PBT 110. The PBT 110 may update the field corresponding to the table address PBADD to the data DATA, at step S744.

At step S746, the control logic circuit 260 of the memory device 200 may receive the address ADDR to generate the row address RADD and the column address CADD, and receive the command CMD to generate the input/output control signal CTRL. The data input/output unit 250 may transmit the data DATA to the page buffer unit 220 and the internal buffer 230 according to the input/output control signal CTRL, and the page buffer unit 220 and the internal buffer 230 may store the transmitted data DATA according to the column address CADD, at step S748. Thus, the internal buffer 230 may retain the same data as the page buffer unit 220.

FIG. 8B illustrates an operation (step S750 of FIG. 7) of the memory system when the comparison signal DIFF is at a logic low level. When the comparison signal DIFF is at a logic low level (that is, "YES" at step S730), the management module 134 may transmit only the write address WADD and the write command WT, without the write data WDATA, as the address ADDR and the command CMD, respectively, to the memory device 200, at step S752. The control logic circuit 260 may receive the address ADDR and generate the row address RADD and the column address CADD, at step S754. At this time, the control logic circuit 260 may generate the input/output control signal CTRL to disable the data input/output unit 250, based on the command CMD.

Then, at step S760, the data stored in the page buffer unit 220 may be written to memory cells which are selected according to the row address RADD and the column address CADD.

As described above, when the write data DATA and the table data PB_DATA stored in the PBT 110 are the same, the memory device 200 may not receive the data DATA from the controller 100, but write data to the selected memory cells, the data being stored in the page buffer unit 220 during the previous read or write operation. Therefore, the memory system can reduce and minimize data toggling by a buffer operation during a write operation.

Hereafter, referring to FIGS. 9 to 10C, the read operation of the memory device in accordance with the present embodiment will be described. In describing the read operation, references will be made to FIG. 6.

Figure 9:
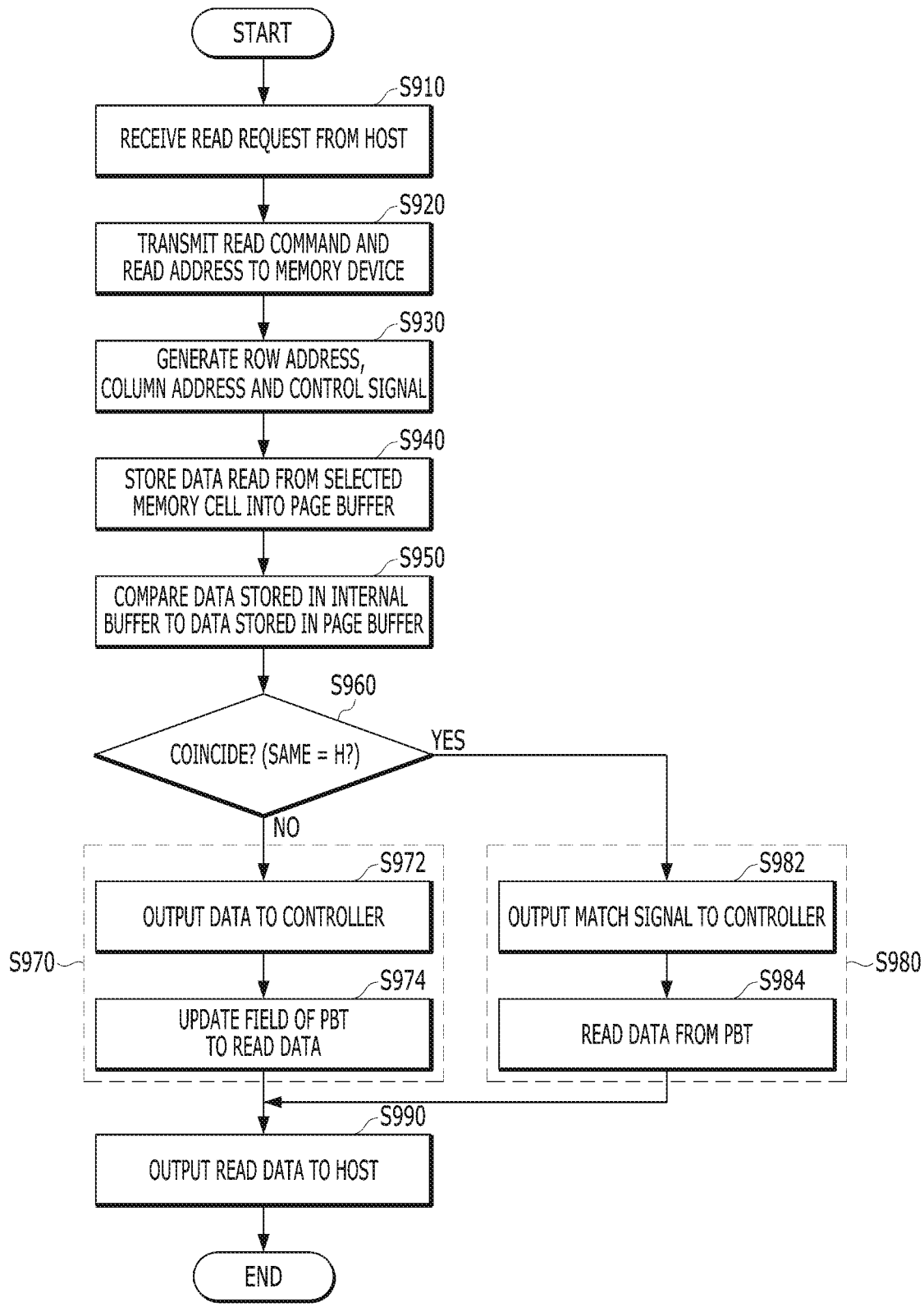
FIG. 9 is a flowchart explaining a read operation of a memory system in accordance with an embodiment of the present invention.
Figure 10A:
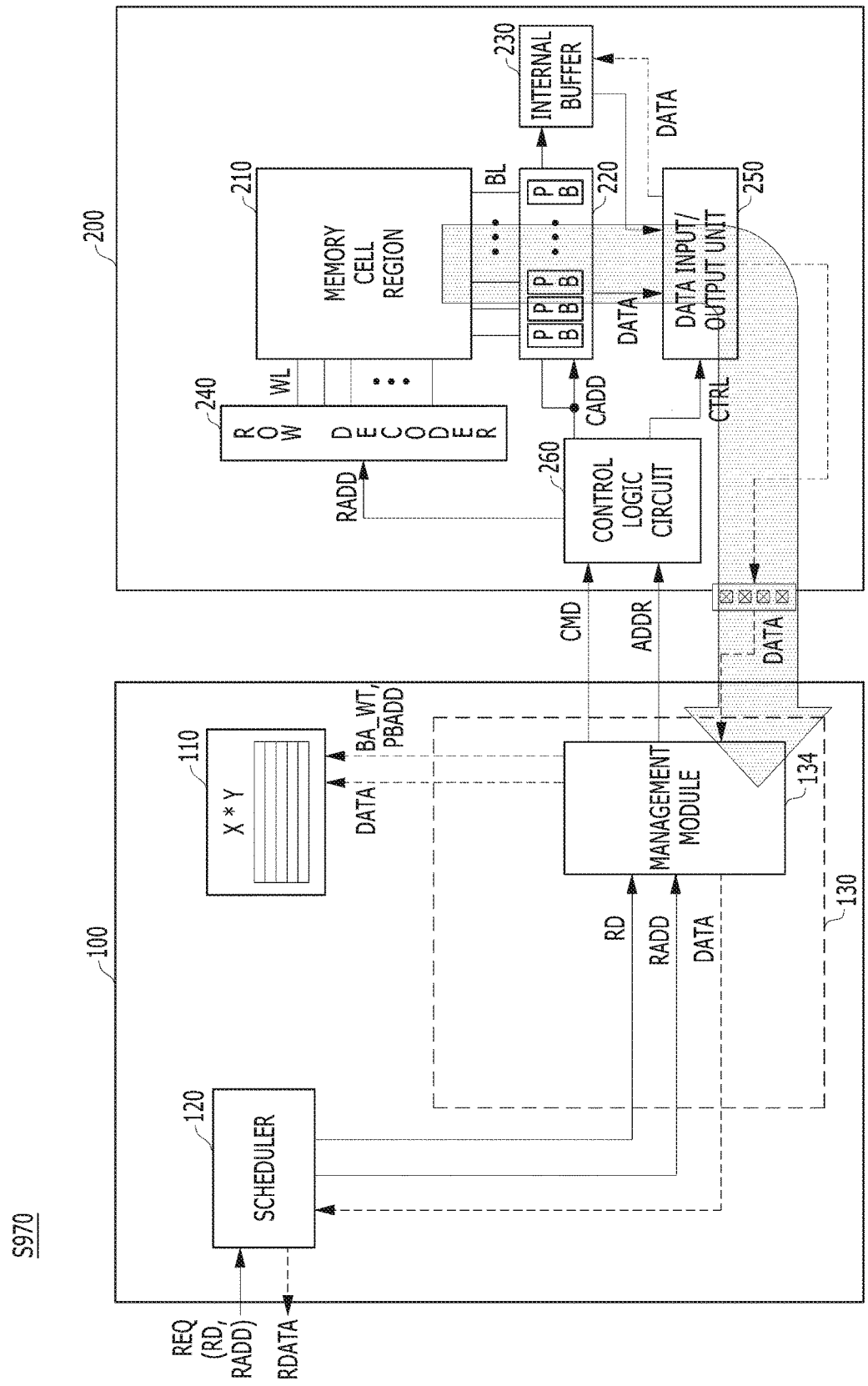
FIGS. 10A to 10C are block diagrams illustrating in detail parts of the read operation of FIG. 9.
Figure 10B:
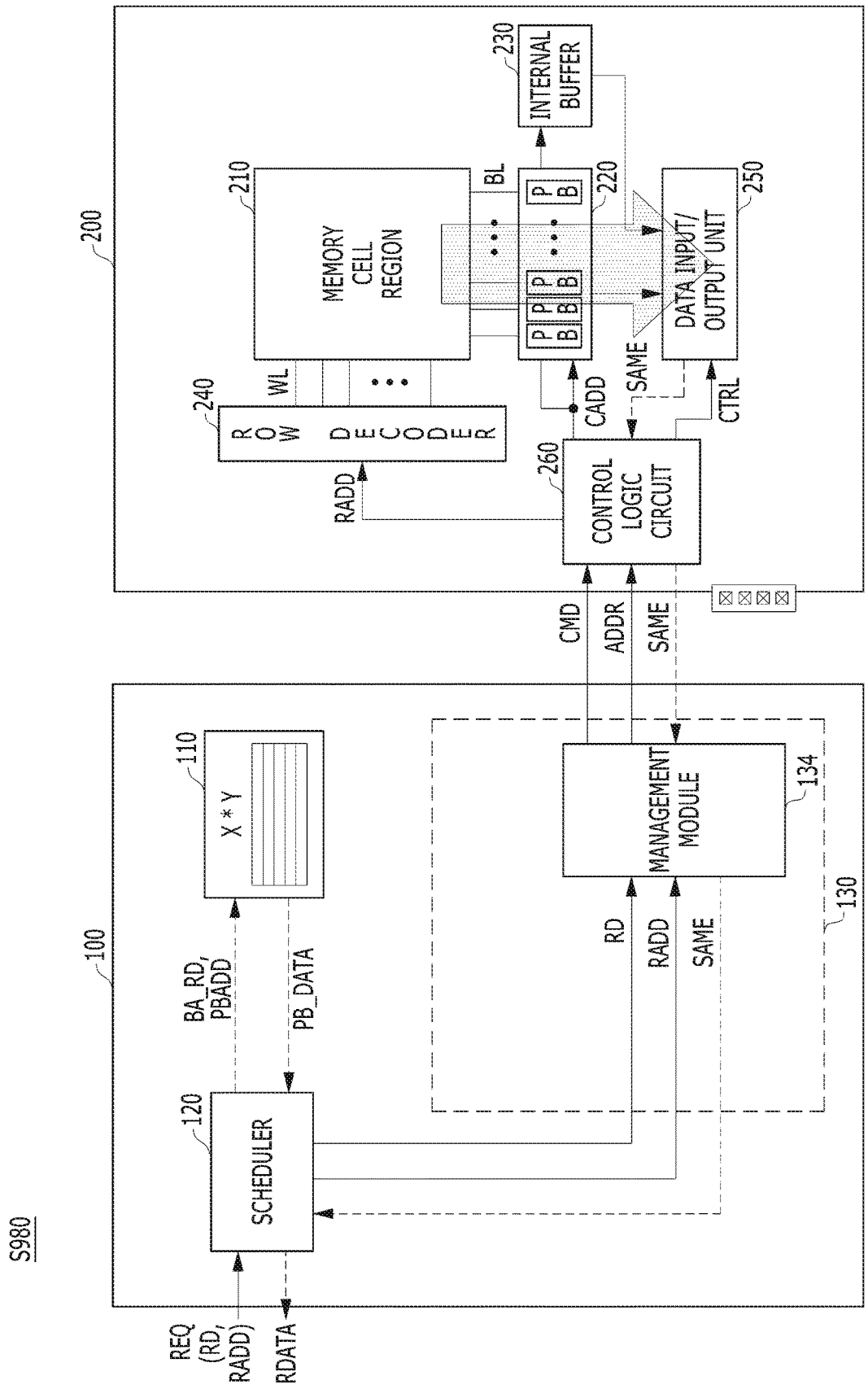
Figure 10C:
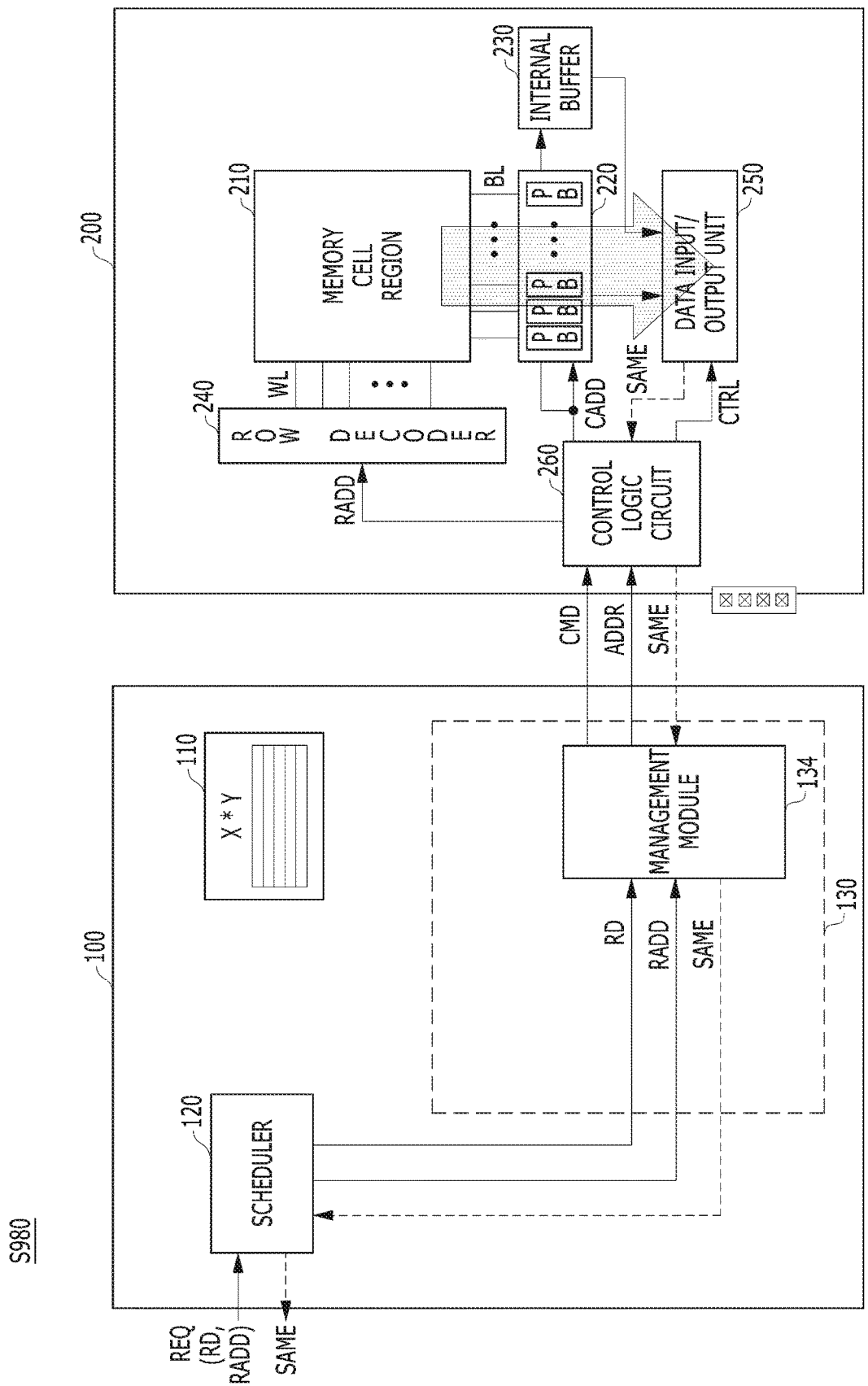

FIG. 9 is a flowchart explaining a read operation of a memory system in accordance with an embodiment of the present invention. FIGS. 10A to 10C are block diagrams illustrating in detail parts of the read operation of FIG. 9. For convenience of description, FIGS. 10A to 10C illustrate only one bank.

Referring to FIG. 9, at step S910, the controller 100 may receive a read request REQ from the host. The read request REQ may include the read address RADD and the read command RD. The scheduler 120 may receive the read request REQ from the host, and adjust an order of operations to be processed by the memory device 200.

Then, at step S920, the management module 134 may provide the read address RADD and the read command RD as the address ADDR and the command CMD, respectively, to the memory device 200. At this time, the management module 134 may set a specific bit of the address ADDR, and provide the address ADDR to the memory device 200.

The control logic circuit 260 of the memory device 200 may receive the address ADDR to generate the row address RADD and the column address CADD, and may generate the input/output control signal CTRL based on the command CMD and the specific bit of the address ADDR, at step S930.

The page buffer unit 220 may store data read from memory cells which are selected according to the row address RADD and the column address CADD, at step S940. The data input/output unit 250 may compare the data stored in the page buffer unit 220 to data stored in the internal buffer 230 according to the input/output control signal CTRL, at step S950.

FIG. 10A illustrates an operation (step S970 of FIG. 9) of the memory system when the comparison result indicates that the data are different from each other. When the comparison result indicates that the data are different from each other (that is, "NO" at step S960), the data input/output unit 250 may output the data stored in the page buffer unit 220 (that is, the data read from the selected memory cells) as the data DATA to the controller 100, at step S972. At this time, the data input/output unit 250 may store the data stored in the page buffer unit 220 into the internal buffer 230, such that the internal buffer 230 can retain the same data as the page buffer unit 220.

The management module 134 may transmit the data DATA provided from the memory device 200, the table address PBADD corresponding to the read address RADD, and the table write command BA_WT to the PBT 110, and the PBT 110 may update a field corresponding to the table address PBADD to the data DATA, at step S974. Furthermore, the management module 134 may transmit the data DATA to the scheduler 120, and the scheduler 120 may provide the data DATA as the read data RDATA to the host, at step S990.

FIG. 10B illustrates an operation (step S980 of FIG. 9) of the memory system when the comparison result indicates that the data are the same. When the comparison result indicates that the data are the same (that is, "YES" at step S960), the data input/output unit 250 may not output the data stored in the page buffer unit 220 (that is, the data read from the selected memory cells), but output the 1-bit match signal SAME to the control logic circuit 260, at step S982.

The management module 134 may transmit the match signal SAME to the scheduler 120, and the scheduler 120 may transmit the table read command BA_RD and the table address PBADD corresponding to the read address RADD to the PBT 110. The PBT 110 may output the table data PB_DATA of a field corresponding to the table address PBADD in response to the table read command BA_RD, at step S984. The scheduler 120 may output the table data PB_DATA as the read data RDATA to the host, at step S990.

In another embodiment, when the host already knows the read data RDATA acquired during the previous read operation according to the spec of the host, the host can calculate the read data RDATA based on the match signal SAME, even though the read data RDATA are not inputted. In this case, when the match signal SAME is inputted as illustrated in FIG. 10C, the scheduler 120 may not output the read data RDATA, but provide the read data RDATA to the host. Since the host already knows the read data RDATA acquired during the previous read operation even though the host does not directly receive the read data RDATA, the host can calculate the read data RDATA based on the read data RDATA acquired during the previous read operation.

As described above, when the data read from the selected memory cells are the same as the data stored in the page buffer unit 220, the controller 100 may not receive the data DATA from the memory device 200, but instead provide the match signal SAME or the table data PB_DATA stored in the PBT 110 to the host. Therefore, the memory system can reduce and minimize data toggling by a buffer operation during the read operation.

In accordance with the various embodiments, the memory system can selectively perform a buffer operation between the controller and a page buffer of the memory device depending on data stored in the page buffer during a write operation and a read operation, thereby minimizing toggling of data and the data strobe signal while reducing power consumption.

Although various embodiments have been described for illustrative purposes, it will be apparent to those skilled in the art that various changes and modifications may be made without departing from the spirit and scope of the invention as defined in the following claims.

What is claimed is:

1. A memory system comprising:
a memory device having a plurality of banks, each bank comprising a memory cell region including a plurality of memory cells, a control logic circuit, a data input/output unit, an internal buffer, and a page buffer unit, wherein the internal buffer corresponds to the page buffer unit in each bank, and is the same size as the page buffer unit in each bank; and
a controller suitable for receiving a write address and write data from a host, and controlling a write operation of the memory device so that during the write operation the write data received by the control logic circuit from the controller is transmitted to the page buffer unit and the internal buffer by the data input/output circuit according to an input/output control signal,
wherein the controller comprises:
a page buffer table (PBT) comprising fields to retain the same data as the page buffer units of the respective banks, wherein the PBT has a plurality of fields corresponding to the number of the banks, and each of the fields has a size corresponding to a size of the page buffer unit in each of the banks; and
a processor suitable for controlling the memory device to write one of the write data and data stored in the page buffer unit to memory cells selected according to the write address by comparing the write data to data stored in a field of the PBT, the field corresponding to the write address,
wherein the processor controls the memory device to write the data stored in the page buffer unit to memory cells to skip a buffer operation between the controller and the page buffer unit, by the control logic circuit generating the input/output control signal to disable the input/output unit when the write data is identical to the data stored in the field of the PBT, otherwise, the control logic circuit generates the input/output control signal to control the input/output unit to transmit the write data received from the controller to the page buffer unit and the internal buffer so that the page buffer unit and the internal buffer store the write data, and the processor selects the field of the PBT according to the write address, and updates the selected field with the write data.

2. The memory system of claim 1, wherein the processor comprises:
a comparison module suitable for comparing the write data to the data stored in the field of the PBT, and outputting a comparison signal; and
a management module suitable for controlling the memory device to write the data stored in the page buffer unit to the selected memory cells when the comparison signal indicates that the data are same, and controlling the memory device to write the write data to the selected memory cells when the comparison signal indicates that the data are different from each other.

3. The memory system of claim 1, wherein the controller receives a read address from the host, and controls a read operation of the memory device, and
wherein, when data read from memory cells selected according to the read address are same as the data stored in the page buffer unit, the memory device does not output the data read from the selected memory cells, but provides a match signal to the controller.

4. The memory system of claim 3, wherein the match signal comprises 1-bit data.

5. The memory system of claim 3, wherein, during the read operation, the controller outputs data stored in a field of the PBT, corresponding to the read address, as read data to the host in response to the match signal.

6. The memory system of claim 3, wherein the controller outputs the match signal instead of read data to the host, during the read operation.

7. The memory system of claim 3, wherein, when the data read from the selected memory cells are different from the data stored in the page buffer unit during the read operation,
the memory device outputs the data read from the selected memory cells as read data, and
the controller outputs the read data to the host, selects the field of the PBT according to the read address, and updates the selected field to the read data.

8. The memory system of claim 1, wherein, during the read operation, the memory device stores the data read from the selected memory cells into the page buffer unit, and compares the data stored in the page buffer unit to the data stored in the internal buffer.

9. The memory system of claim 1, wherein the controller further comprises:
a scheduler suitable for receiving the write address and the write data from the host, and performing scheduling to write the same write data to the same bank.

10. The memory system of claim 1, wherein each of the fields of the PBT is selected according to an address containing rank information, bank group information and bank information.

11. The memory system of claim 1, wherein the PBT comprises a static random access memory (SRAM).

12. An operation method of a memory system, comprising:
providing a memory device having a plurality of banks, each bank including a memory cell region including a plurality of memory cells, a control logic circuit, a data input/output unit, an internal buffer, and a page buffer unit, wherein the internal buffer corresponds to the page buffer unit in each bank, and is the same size as the page buffer unit in each bank; and
providing a controller including a page buffer table (PBT) having fields to retain the same data as the page buffer units of the respective banks, wherein the PBT has a plurality of fields corresponding to the number of the banks, and each of the fields has a size corresponding to a size of the page buffer unit in each of the banks;
receiving a write address and write data from a host, wherein during a write operation the write data received by the control logic circuit from the controller is transmitted to the page buffer unit and the internal buffer by the data input/output unit according to an input/output control signal;
outputting a comparison signal by comparing the write data to data stored in a field of the PBT, the field corresponding to the write address;
writing data stored in the page buffer unit to memory cells selected according to the write address to skip a buffer operation between the controller and the page buffer unit, by generating the input/output control signal to disable the input/output unit when the comparison signal indicates that the data are same; and
writing the write data to the selected memory cells and generating the input/output control signal to control the input/output unit to transmit the write data received from the controller to the page buffer unit and the internal buffer so that the page buffer unit and the internal buffer store the write data when the comparison signal indicates that the data are different from each other.

13. The operation method of claim 12, further comprising:
selecting the field of the PBT according to the write address, and updating the selected field to the write data, when the comparison signal indicates that the data are different from each other.

14. The operation method of claim 12, further comprising:
performing scheduling to write the same write data to the same bank.

15. An operation method of a memory system, comprising:
providing a memory device having a plurality of banks, each bank including a memory cell region including a plurality of memory cells, an internal buffer, and a page buffer unit, wherein the internal buffer corresponds to the page buffer unit in each bank, and is the same size as the page buffer unit in each bank; and
providing a controller including a page buffer table (PBT) having fields to retain the same data as the page buffer units of the respective banks, wherein the PBT has a plurality of fields corresponding to the number of the banks, and each of the fields has a size corresponding to a size of the page buffer unit in each of the banks;
receiving a read address from a host;
reading data from a memory cell according to the read address;
storing the data which is read in the page buffer unit;
comparing, by the memory device, data in the page buffer unit to data stored in the internal buffer from a last operation;
outputting, by the memory device, a match signal to the controller without outputting the data read from the page buffer unit to skip a buffer operation between the controller and the page buffer unit, when a comparison result indicates that the data are same; and
outputting, by the memory device, the data read from the page buffer unit as read data to the controller, and storing the data stored in the page buffer unit into the internal buffer so that the internal buffer can retain the same data as the page buffer unit, when the comparison result indicates that the data are different from each other.

16. The operation method of claim 15, further comprising:
selecting, by the controller, a field of the PBT according to the read address, and updating the selected field to the read data, when the comparison result indicates that the data are different from each other.

17. The operation method of claim 15, wherein the match signal comprises 1-bit data.

18. The operation method of claim 15, wherein the controller outputs data stored in a field of the PBT, corresponding to the read address, as the read data to the host in response to the match signal.

19. The operation method of claim 15, wherein the controller outputs the match signal instead of the read data to the host.

* * * * *